United States Patent
Cheng

(10) Patent No.: US 7,605,630 B2
(45) Date of Patent: Oct. 20, 2009

(54) DELAY CIRCUIT

(75) Inventor: Wen-Chang Cheng, Taoyuan County (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 0 days.

(21) Appl. No.: 11/845,594

(22) Filed: Aug. 27, 2007

(65) Prior Publication Data

US 2008/0290922 A1 Nov. 27, 2008

(30) Foreign Application Priority Data

May 24, 2007 (TW) .............................. 96118490 A

(51) Int. Cl.
*H03H 11/26* (2006.01)
(52) U.S. Cl. .................. 327/284; 327/264; 327/407; 327/408
(58) Field of Classification Search ................. 327/264, 327/407, 408, 284
See application file for complete search history.

(56) References Cited

U.S. PATENT DOCUMENTS

| | | | | |
|---|---|---|---|---|
| 5,625,303 A | * | 4/1997 | Jamshidi | 326/106 |
| 5,949,269 A | * | 9/1999 | Allen | 327/285 |
| 6,297,679 B1 | * | 10/2001 | Kim | 327/276 |
| 2006/0170459 A1 | * | 8/2006 | Shin et al. | 326/113 |

* cited by examiner

*Primary Examiner*—Lincoln Donovan
*Assistant Examiner*—Daniel Rojas
(74) *Attorney, Agent, or Firm*—Winston Hsu

(57) ABSTRACT

A delay circuit respectively delays rising and falling edges of an input signal. The delay circuit comprises first and second delay lines, a control circuit, and first and second logic circuits. The first delay line delays the first input signal the first delay time to output the first delay output signal. The second delay line delays the first input signal the second delay time to output the second delay output signal. The control circuit outputs the control signal according to the first input signal. The first logic circuit receives the first delay output signal and outputs the first output signal according to the control signal and the first input signal. The second logic circuit receives the second delay output signal and outputs the second output signal according to the control signal and the first input signal. The first and second delay times are different.

10 Claims, 3 Drawing Sheets

DELAY CIRCUIT

BACKGROUND OF THE INVENTION

1. Field of the Invention

The invention relates to a delay circuit, and in particular to a delay circuit to respectively adjust rising and falling edges of an input signal.

2. Description of the Related Art

FIG. 1 is a schematic diagram of a conventional delay circuit 100. Delay circuit 100 comprises delay inverters 101, 102 and 103 and delay inverse circuit 110. Delay inverse circuit 110 comprises PMOS transistor 111 (Positive-channel Metal Oxide Semiconductor Transistor), NMOS transistor 112 (Negative-channel Metal Oxide Semiconductor Transistor), and buffer 104. In addition, PMOS transistor 111 and NMOS transistor 112 form a CMOS (Complementary Metal Oxide Semiconductor) inverter.

Delay circuit 100 adjusts rising speed, falling speed and delay time of signals according to the charge capacity of PMOS transistor 111, the discharge capacity of NMOS transistor 112 and P/N ratio. However, conventional delay circuit 100 cannot separately adjust the delay time of rising and falling edges of a signal.

BRIEF SUMMARY OF THE INVENTION

A detailed description is given in the following embodiments with reference to the accompanying drawings.

An embodiment of a delay circuit for adjusting delay times of rising and falling edges of an input signal is provided. The delay circuit comprises a first delay line, a second delay line, a control circuit, a first logic circuit, and a second logic circuit. The first delay line receives a first input signal and delays the first input signal a first delay time to output a first delay output signal. The second delay line receives the first input signal and delays the first input signal a second delay time to output a second delay output signal. The control circuit outputs a control signal according to the first input signal. The first logic circuit receives the first delay output signal and outputs a first output signal according to the control signal. The second logic circuit receives the second delay output signal and outputs a second output signal according to the control signal. In addition, the first logic circuit and the second logic circuit do not output the first output signal and the second output signal simultaneously.

Another embodiment of a delay circuit for adjusting delay times of rising and falling edges of an input signal is provided. The delay circuit comprises an inverse circuit, a first delay line, a second delay line, a control circuit, a first logic circuit, a second logic circuit, a first inverse circuit, and a second inverse circuit. The inverse circuit inverts the input signal to output a first input signal. The first delay line receives the first input signal and delays the first input signal a first delay time to output a first delay output signal. The second delay line receives the first input signal and delays the first input signal a second delay time to output a second delay output signal. The control circuit outputs a control signal according to the first input signal. The first logic circuit receives the first delay output signal and outputs a first output signal according to the control signal. The second logic circuit receives the second delay output signal and outputs a second output signal according to the control signal. The first inverse circuit inverts the first output signal or the second output signal to output an inverse output signal. The second inverse circuit inverts the inverse output signal to output an output signal. In addition, the first logic circuit and the second logic circuit do not output the first output signal and the second output signal simultaneously and lengths of the first delay time and the second delay time are different.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
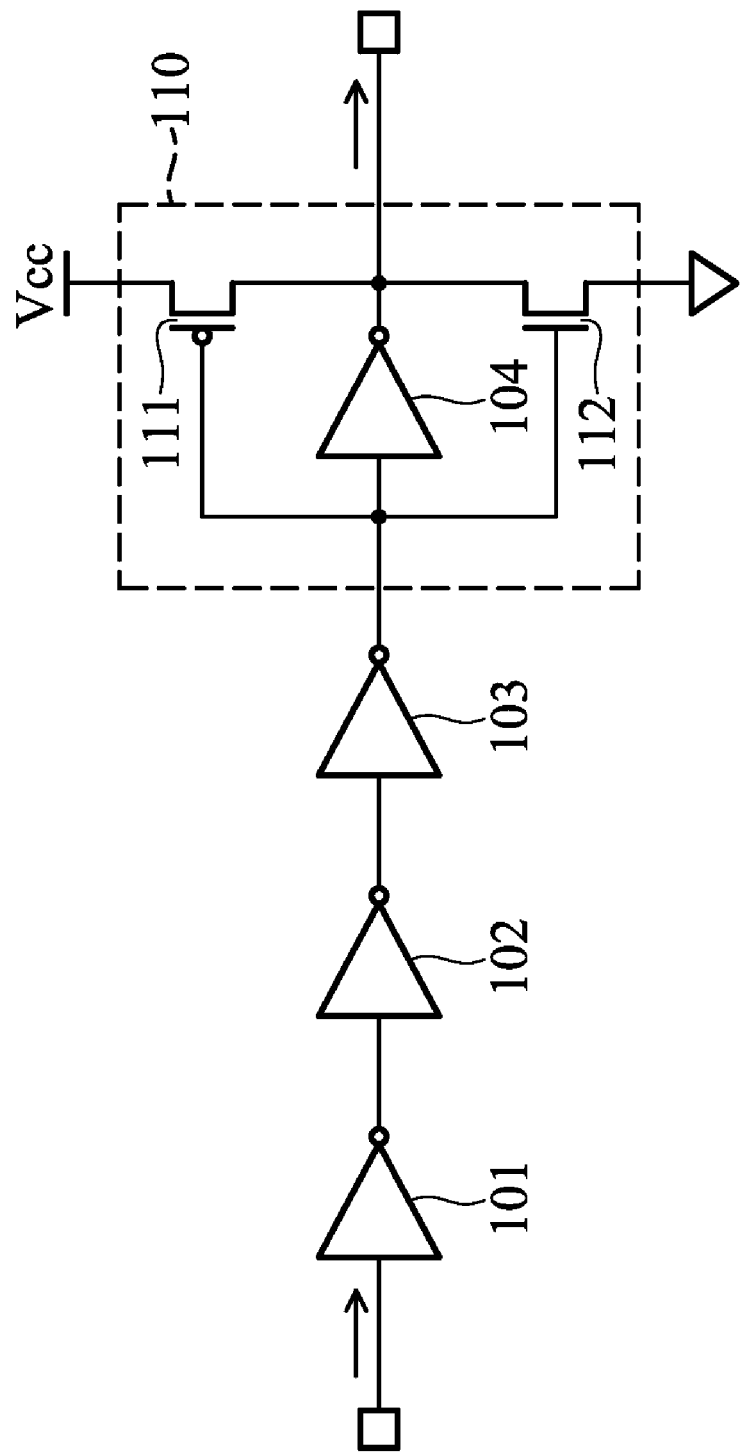
FIG. 1 is a schematic diagram of a conventional delay circuit.
Figure 2:
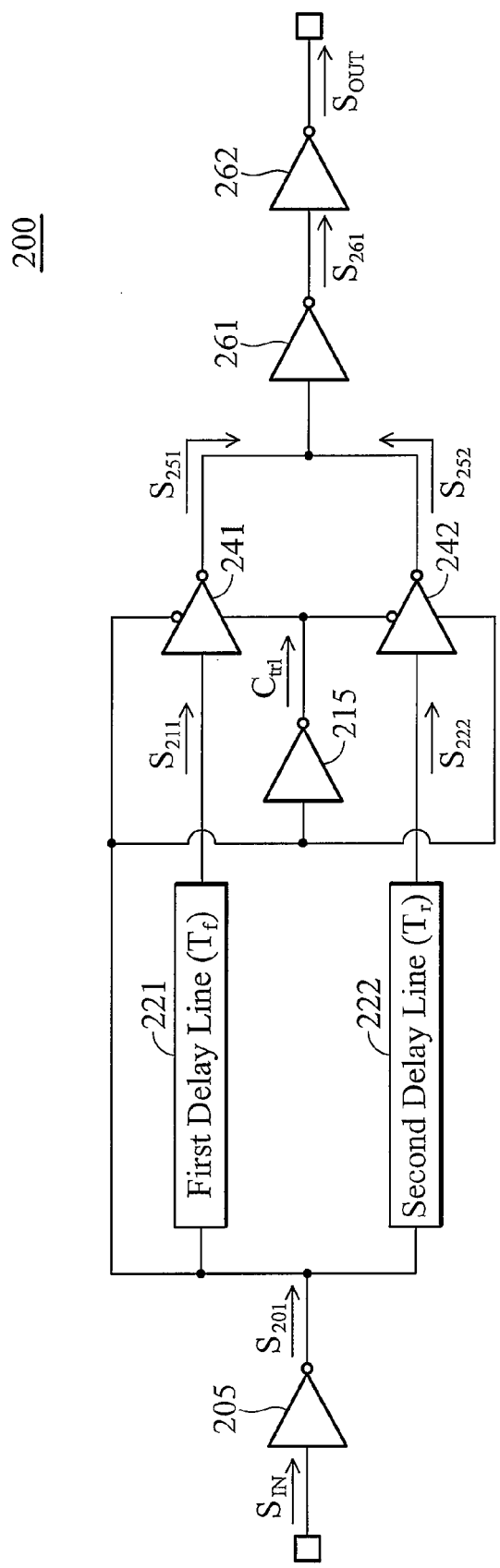
FIG. 2 is a schematic diagram of a delay circuit according to an embodiment of the invention.

FIG. 2 is a schematic diagram of delay circuit 200 according to an embodiment of the invention. Delay circuit 200 can respectively adjust delay time of rising and falling edges of input signal $S_{201}$. Delay circuit 200 comprises inverse circuit 205, first delay line 221, second delay line 222, control circuit 215, first logic circuit 241, second logic circuit 242, first inverse circuit 261 and second inverse circuit 262.

Inverse circuit 205 inverts input signal $S_{IN}$ to generate first input signal $S_{201}$. First delay line 221 receives first input signal $S_{201}$ and delays first input signal $S_{201}$ first delay time $T_f$ to output first delay output signal $S_{211}$. Second delay line 222 receives first input signal $S_{201}$ and delays first input signal $S_{201}$ second delay time Tr to output second delay output signal $S_{222}$. Control circuit 215 inverts first input signal $S_{201}$ to output control signal $C_{trl}$. First logic circuit 241 receives first delay output signal $S_{211}$ and outputs first output signal $S_{251}$ according to control signal $C_{trl}$ and first input signal $S_{201}$. Second logic circuit 242 receives second delay output signal $S_{222}$ and outputs second output signal $S_{252}$ according to control signal $C_{trl}$ and first input signal $S_{201}$. First inverse circuit 261 inverts first output signal $S_{251}$ or second output signal $S_{252}$ to output inverse signal $S_{261}$. Second inverse circuit 262 inverts inverse signal $S_{261}$ outputting output signal $S_{OUT}$.

First logic circuit 241 and second logic circuit 242 do not simultaneously output first output signal $S_{251}$ and second output signal $S_{252}$. Lengths of first delay time $T_f$ and second delay time $T_r$ can be different. If first input signal $S_{201}$ is low voltage level (logic 0), input signal $S_{IN}$ being high voltage level, first logic circuit 241 is turned on to output first output signal $S_{251}$ according to control signal $C_{trl}$ and first input signal $S_{201}$. If first input signal $S_{201}$ is high voltage level (logic 1), input signal $S_{IN}$ being low voltage level, second logic circuit 242 is turned on to output second output signal $S_{252}$ according to control signal $C_{trl}$ and first input signal $S_{201}$. Thus, delay circuit 200 can respectively adjust delay time of rising and falling edges of input signal $S_{IN}$. According to another embodiment of the invention, control circuit 215 is an inverse circuit. First logic circuit 241 is the first inverter and second logic circuit 242 is the second inverter. If first input signal $S_{201}$ is low voltage level (logic 0), first inverter 241 inverts first delay output signal $S_{211}$ to output first output signal $S_{251}$. If first input signal $S_{201}$ is high voltage level (logic 1), second inverter 242 inverts second delay output signal $S_{222}$ to output second output signal $S_{252}$.

If first input signal $S_{201}$ has a rising edge (input signal $S_{IN}$ has a falling edge), input signal $S_{IN}$ goes through second logic circuit 242 to output second output signal $S_{252}$ to inverse circuits 261 and 262 outputting output signal $S_{OUT}$. If first input signal $S_{201}$ has a falling edge (input signal $S_{IN}$ has a rising edge), input signal $S_{IN}$ goes through first logic circuit 241 to output first output signal $S_{251}$ to inverse circuits 261 and 262 outputting output signal $S_{OUT}$. If input signal $S_{IN}$ has a rising edge and a falling edge, first logic circuit 241 and second logic circuit 242 respectively output first output signal $S_{251}$ and second output signal $S_{252}$ to inverse circuits 261 and 262.

Figure 3:
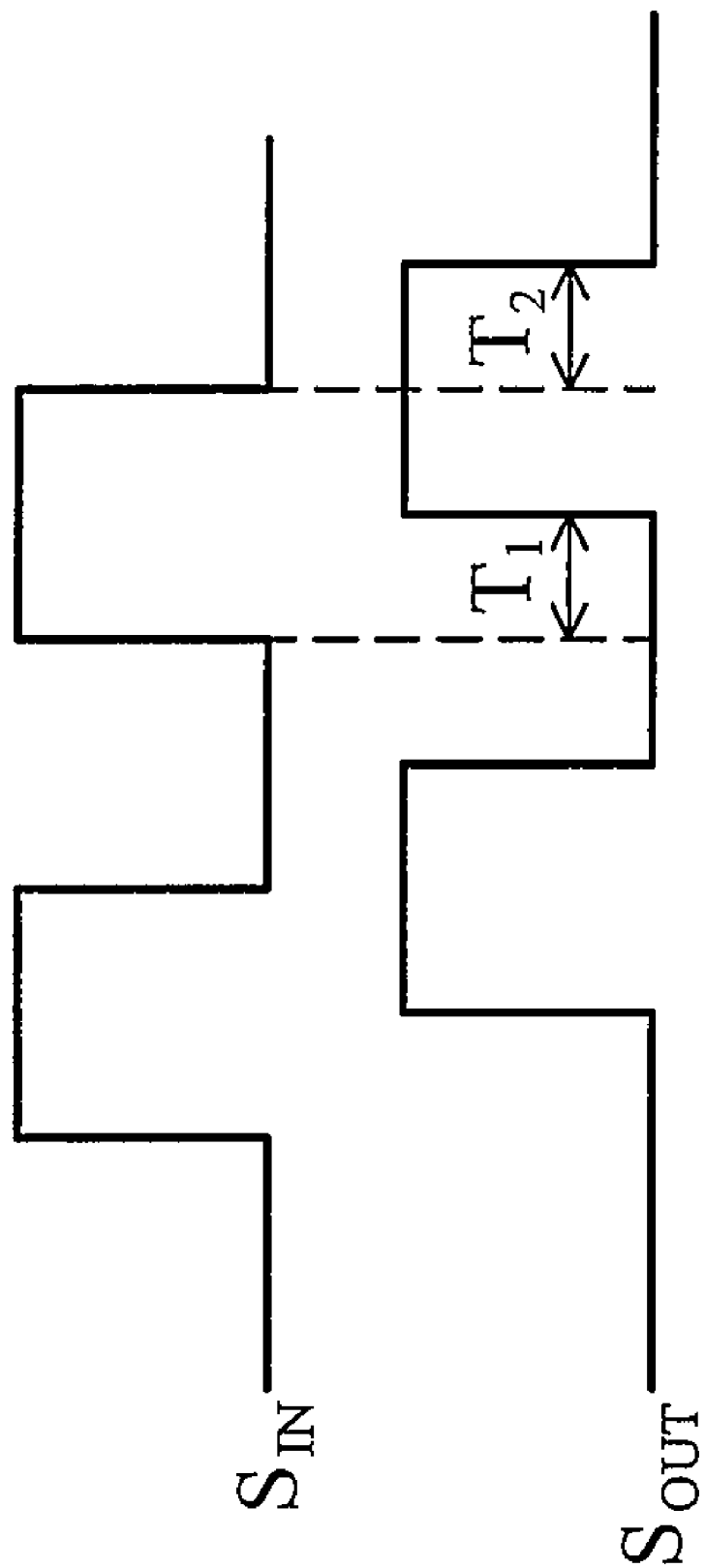
FIG. 3 is a schematic diagram of an input signal and an output signal according to another embodiment of the invention.

FIG. 3 is a schematic diagram of input signal $S_{IN}$ and output signal $S_{OUT}$ according to another embodiment of the invention. As shown, the time difference between rising edges of input signal $S_{IN}$ and output signal $S_{OUT}$ is delay time $T_1$ (delay time $T_1$ corresponds to delay time $T_f$), and the time difference between falling edges of input signal $S_{IN}$ and output signal $S_{OUT}$ is delay time $T_2$ (delay time $T_2$ is corresponding to delay time $T_r$). Delay circuit 200 can adjust delay times $T_r$ and $T_f$ of first delay line 221 and second delay line 222 to respectively adjust rising and falling edges of input signal $S_{IN}$ outputting output signal $S_{OUT}$.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay circuit for adjusting delay times of rising and falling edges of an input signal, comprising:
    a first delay line, having a first input terminal for receiving a first input signal and delaying the first input signal a first delay time to output a first delay output signal; a second delay line, having a second input terminal for receiving the first input signal and delaying the first input signal a second delay time to output a second delay output signal, wherein the first input signal is utilized as a control signal;
    a first logic circuit receiving the first delay output signal and outputting a first output signal according to the control signal; and
    a second logic circuit receiving the second delay output signal and outputting a second output signal according to the control signal;
wherein the first logic circuit and the second logic circuit do not output the first output signal and the second output signal simultaneously, where if the first input signal is low voltage level, the first logic circuit is turned on to output the first output signal according to the control signal, and if the first input signal is high voltage level, the second logic circuit is turned on to output the second output signal according to the control signal.

2. The delay circuit as claimed in claim 1, wherein lengths of the first delay time and the second delay time are different.

3. The delay circuit as claimed in claim 1, fun her comprising: an inverse circuit inverting the input signal to generate the first input signal; a first inverse circuit inverting the first output signal or the second output signal to output an inverse output signal; and a second inverse circuit inverting the inverse output signal to output an output signal.

4. The delay circuit as claimed in claim 1, wherein the control circuit is a third inverse circuit.

5. The delay circuit as claimed in claim 1, wherein the first logic circuit is a first inverter, and if the first input signal is low voltage level, the first inverter inverts the first delay output signal to output the first output signal.

6. The delay circuit as claimed in claim 1, wherein the second logic circuit is a second inverter, and if the first input signal is high voltage level, the second inverter inverts the second delay output signal to output the second output signal.

7. A delay circuit for adjusting delay times of rising and falling edges of an input signal, comprising:
    an inverse circuit inverting the input signal to output a first input signal, wherein the first input signal is utilized as a control signal;
    a first delay line, having a first input terminal for receiving the first input signal and delaying the first input signal a first delay time to output a first delay output signal;
    a second delay line, having a second input terminal for receiving the first input signal and delaying the first input signal a second delay time to output a second delay output signal;
    a first logic circuit receiving the first delay output signal and outputting a first output signal according to the control signal;
    a second logic circuit receiving the second delay output signal and outputting a second output signal according to the control signal;
    a first inverse circuit inverting the first output signal or the second output signal to output an inverse output signal; and
    a second inverse circuit inverting the inverse output signal to output an output signal; wherein the first logic circuit and the second logic circuit do not output the first output signal and the second output signal simultaneously and wherein lengths of the first delay time and the second delay time are different, where if the first input signal is low voltage level, the first logic circuit is turned on to output the first output signal according to the control signal, and if the first input signal is high voltage level, the second logic circuit is turned on to output the second output signal according to the control signal.

8. The delay circuit as claimed in claim 7, wherein the control circuit is a third inverse circuit.

9. The delay circuit as claimed in claim 7, wherein the first logic circuit is a first inverter, and if the first input signal is low voltage level, the first inverter inverts the first delay output signal to output the first output signal.

10. The delay circuit as claimed in claim 7, wherein the second logic circuit is a second inverter, and if the first input signal is high voltage level, the second inverter inverts the second delay output signal to output the second output signal.

* * * * *